US007683741B2

(12) United States Patent
Ito et al.

(10) Patent No.: US 7,683,741 B2
(45) Date of Patent: Mar. 23, 2010

(54) PACKAGE FOR SUPPRESSING SPURIOUS RESONANCE IN AN FBAR

(75) Inventors: Hiroyuki Ito, Kanagawa (JP); Hasnain Lakdawala, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 11/936,254

(22) Filed: Nov. 7, 2007

(65) Prior Publication Data

US 2009/0115552 A1 May 7, 2009

(51) Int. Cl.
*H03H 11/10* (2006.01)
*H03H 9/02* (2006.01)
*H01L 41/04* (2006.01)
*H03B 5/32* (2006.01)

(52) U.S. Cl. .................... 333/187; 333/216; 331/116 R; 331/158

(58) Field of Classification Search ......... 333/187–189, 333/216; 331/158, 116 R, 116 FE
See application file for complete search history.

(56) References Cited

U.S. PATENT DOCUMENTS 3,766,496 A * 10/1973 Whitehouse ............ 331/107 A 6,573,788 B2 * 6/2003 Oppelt ...................... 330/61 A

FOREIGN PATENT DOCUMENTS

EP        0 375 570 A2 *  6/1990   .............. 310/311

OTHER PUBLICATIONS

Derwent abstract only of EP 375 570 A, published Jun. 27, 1990.*
Yanai et al.; "Q-Value Control of Piezoelectric Vibrator Using Operational Amplifier Circuit"; Japanese Journal of Applied Physics; vol. 36, Part 1, No. 5B, May 1997, pp. 3034-3036.*

* cited by examiner

*Primary Examiner*—Barbara Summons
(74) *Attorney, Agent, or Firm*—Grossman, Tucker, Perreault & Pfleger, PLLC

(57) ABSTRACT

Disclosed is a package having a thin film bulk acoustic resonator (FBAR). The package may be utilized for suppressing spurious resonance occurred during operation of the FBAR. The package includes a negative impedance converter (NIC) operatively coupled to the FBAR through at least one interconnect. The at least one interconnect includes transmission lines and bonding wires. The package further includes a filter operatively coupled to the NIC. The filter exhibits a parallel resonance at a predefined frequency. The parallel resonance exhibited by the filter is converted to a series resonance by the NIC such that the series resonance of the NIC is responsible for suppressing the spurious resonance occurring during the operation of the FBAR.

5 Claims, 4 Drawing Sheets

PACKAGE FOR SUPPRESSING SPURIOUS RESONANCE IN AN FBAR

FIELD

The present disclosure relates to a thin film bulk acoustic resonator (FBAR), and, more particularly, to suppressing spurious resonance in an FBAR.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, refer to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

Figure 1:
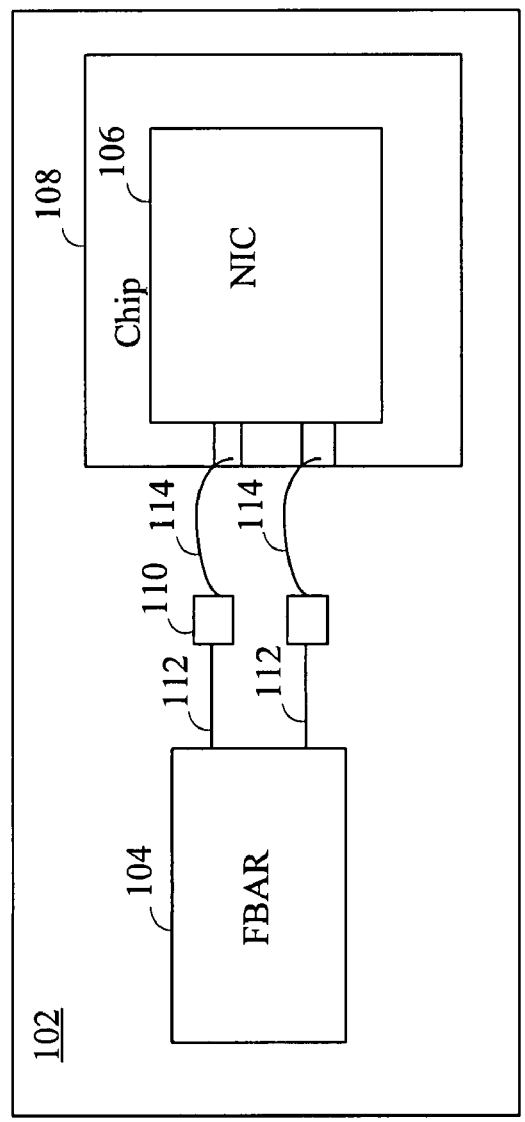
FIG. 1 is a block diagram illustrating a prior art package including a thin film bulk acoustic resonator (FBAR)

FIG. 1 is a block diagram illustrating a prior art package 100 for use in a thin film bulk acoustic resonator (FBAR) oscillator. The package includes a board 102 having a FBAR 104. The term "film" in FBAR refers to a thin piezoelectric film such as Aluminum Nitride (AlN) sandwiched between two electrodes. Piezoelectric films have the property of mechanically vibrating in the presence of an electric field as well as producing an electric field if mechanically vibrated. The term "bulk" in FBAR refers to the body or thickness of the sandwich. When an alternating voltage is applied across the electrodes, the film begins to vibrate. The term "acoustic" in FBAR refers to mechanical vibration that resonates within the "bulk" of the FBAR. The resonation enables removal of unwanted frequencies from being transmitted in the FBAR, while allowing other specific frequencies to be received and transmitted.

As described herein, the package 100 includes a negative impedance converter (NIC) 106 coupled to the FBAR 104. The NIC 106 may be a complimentary metal oxide semiconductor (CMOS) circuit. The NIC 106 may be fabricated on a chip, for example, a chip 108 mounted on the board 102. The NIC 106 may be coupled to the FBAR 104 through at least one interconnect. The at least one interconnect may include transmission line and bonding wires. More specifically, the NIC 106 and the FBAR 104 may be connected to the board 102 at a common point 110 through transmission lines 112 and bonding wires 114, respectively. Accordingly, length of interconnect between the FBAR 104 and the NIC 106 may become large (about 1 mm). Due to the large length of interconnect, the inductance of interconnect becomes appreciable at high frequencies, thereby causing spurious resonance in the FBAR 104.

Figures 2A, 2B:
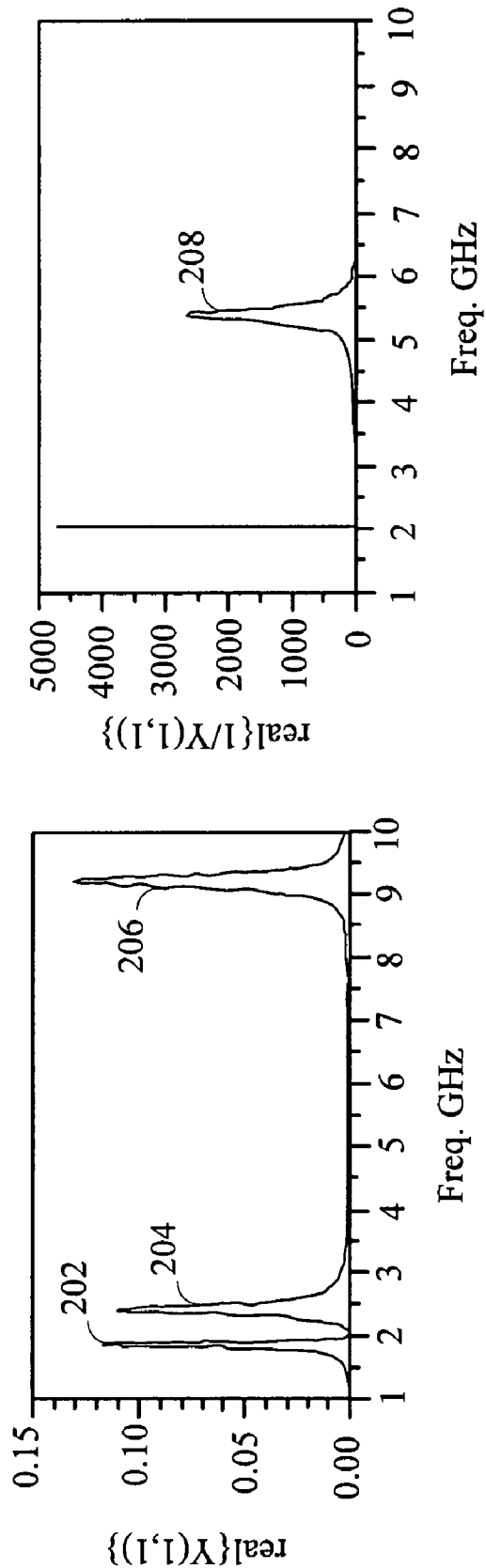
FIGS. 2A and 2B show graphs illustrating frequency variation of the FBAR of the prior art package of FIG. 1 during a series resonance and a parallel resonance, respectively.

FIGS. 2A and 2B show graphs illustrating frequency response of the FBAR 104 of the prior art package 100 during a series resonance and a parallel resonance, respectively. During series resonance of the FBAR 104, the variation of frequency is plotted against effective impedance of the FBAR 104, as illustrated in FIG. 2A. The frequency variation shows a sudden increase in frequency at one or more frequencies (marked by 202, 204 and 206). More specifically, at the one or more frequencies, the effect of inductance of the at least one interconnect (hereinafter referred to as interconnect) becomes prominent, thereby increasing the effective impedance of the FBAR 104. The increased effective impedance interferes with the series resonance of the FBAR 104, thereby causing spurious resonance in the oscillator that is a function of the parasitic interconnect 104. Similarly, during the parallel resonance of the FBAR 104, the frequency variation of the FBAR based oscillator 104 is very high at one or more frequencies (marked by 208), as illustrated in FIG. 2B. The sudden increase in frequency occurs due to the increased effective impedance of the FBAR 104, thereby resulting in spurious resonance of the FBAR based oscillator 104.

The present disclosure provides a package for use in a FBAR oscillator. The package includes a FBAR and a NIC operatively coupled to the FBAR through at least one interconnect. The at least one interconnect is responsible for exhibiting spurious resonance of the FBAR at a predefined frequency. For suppressing the spurious resonance, a filter is operatively coupled to the NIC. The filter exhibits a first resonance at the predefined frequency based on an impedance of the filter. In response to the first resonance exhibited by the filter, the NIC exhibits a second resonance. The second resonance exhibited by the NIC is capable of suppressing the spurious resonance of the FBAR.

Figure 3:
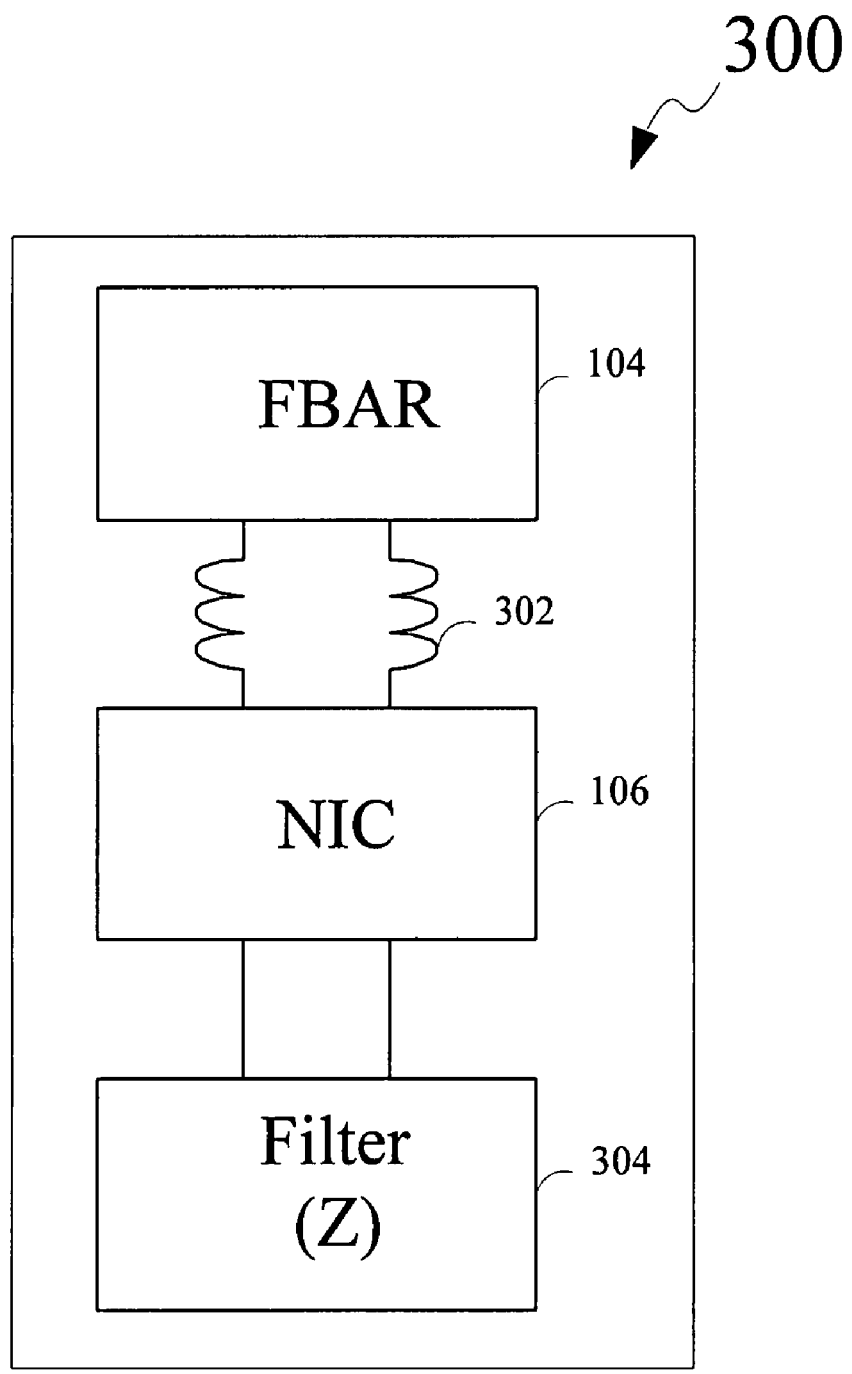
FIG. 3 illustrates a package for suppressing spurious resonance in a FBAR, in accordance with an embodiment of the present disclosure.

FIG. 3 illustrates a package 300 for suppressing spurious resonance of the FBAR 104, in accordance with an embodiment of the present disclosure. The package 300 includes the FBAR 104 operatively coupled to the NIC 106 through the transmission lines and the bonding wires (collectively referred to as interconnect, hereinafter referred to as interconnect 302). As already mentioned, at high frequencies, the inductance of the interconnect 302 between the FABR 104 and the NIC 106 may become significant, thereby interfering with the series resonance and the parallel resonance of the FABR 104 and causing spurious resonance. Accordingly, a filter 304 may be connected with the FBAR 104 so as to filter unwanted frequencies occurring during spurious resonance. However, the filter 304 may not be connected directly to the FBAR since such a circuit arrangement degrades a Quality factor of the FBAR 104. Instead, the filter 304 may be coupled to the FBAR 104 through the NIC 106. More specifically, the filter 304 may be operatively coupled to the NIC 306 and the NIC 306 may be further coupled to the FBAR 104.

In one embodiment, the filter 304 may be a low pass filter (LPF). The filter 304 may have an impedance Z. At frequency of resonance, the value of impedance Z is small, thereby enabling the FBAR 104 to work. However, at high frequencies of resonance, the impedance of the interconnect 302 may become appreciable, thereby increasing the effective impedance of the FBAR 104 and causing spurious resonance.

Figure 4:
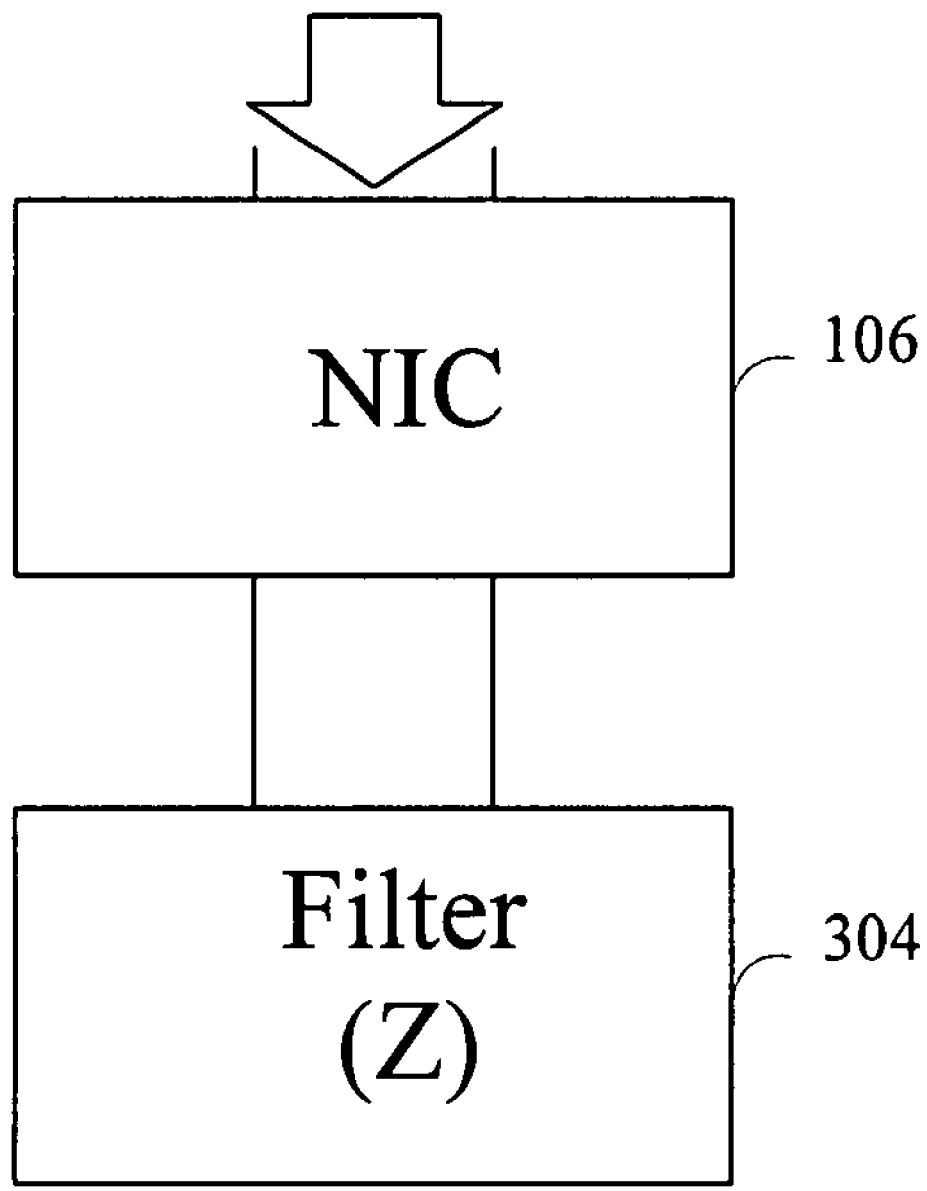
FIG. 4 illustrates input admittance provided by a negative impedance converter (NIC) and a filter of the package of FIG. 3.

FIG. 4 illustrates an input admittance provided by the NIC 106 and the filter [#] 304 of the package 300 of FIG. 3. The input admittance $Y_{out}$ of the filter 304 in combination with the NIC 106 is related to the impedance Z of the filter by the following formula:

$$Y_{out} = g_m^2 Z.$$

In the above formula, $g_m$ refers to gyration constant.

At a predefined frequency, the interconnect 302 may exhibit a spurious resonance. In one embodiment, the spurious resonance may be a parallel resonance at the predefined frequency, $f_{para}$. Accordingly, a parallel resonance of the filter 304 at $f_{para}$ may be converted to a series resonance by the NIC 106. Moreover, a small impedance corresponding to the input admittance $Y_{out}$ reduces an effective impedance at $f_{para}$. Accordingly, a parallel resonance of filter 304 at $f_{para}$ may suppress the parallel resonance of the interconnect, thereby reducing the spurious resonance of the FBAR 104.

In one embodiment, the impedance Z of the filter 304 may be inductive reactance along with a series capacitor, and Z is represented by the following formula:

$$Z = j\omega L + 1/\omega jC.$$

In the above formula, L is the inductance of the filter 304. Accordingly, the inductance of filter 304 may cancel out effects of the spurious inductance of the interconnect 302. The filter is designed to be a low impedance at the FBAR frequency and a higher impedance at all frequencies other than the FBAR resonance frequency, thereby reducing the spurious resonance of the FBAR 104.

As described above, the present disclosure provides a package/circuit enabling reduction of spurious resonance in the FBAR by employing a filter and NIC combination in parallel with the FBAR. The package of the present disclosure may be advantageously employed in an FBAR oscillator without resulting in a substantial degradation of the Quality factor of the FBAR, since the filter is not directly connected to the FBAR.

The foregoing descriptions of specific embodiments of the present disclosure have been presented for purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A package, comprising:
    a thin film bulk acoustic resonator (FBAR);
    a negative impedance converter (NIC) operatively coupled to the FBAR using at least one interconnect, the at least one interconnect being responsible for exhibiting spurious resonance of the FBAR at a predefined frequency; and
    a filter operatively coupled to the NIC, the filter exhibiting a first resonance at the predefined frequency based on an impedance of the filter;
    wherein the NIC exhibits a second resonance in response to the first resonance exhibited by the filter; and
    wherein the second resonance exhibited by the NIC is capable of suppressing the spurious resonance of the FBAR.

2. The package of claim 1, wherein the spurious resonance is a parallel resonance of the FBAR.

3. The package of claim 1, wherein the first resonance is a parallel resonance, and wherein the second resonance is a series resonance.

4. The package of claim 1, wherein the spurious resonance is based on an impedance of the at least one interconnect.

5. The package of claim 1, wherein the filter comprises an inductor and a capacitor.

* * * * *